(12) United States Patent
Nakashima et al.

(10) Patent No.: US 7,947,893 B2
(45) Date of Patent: May 24, 2011

(54) SOLAR CELL AND SOLAR CELL MODULE

(75) Inventors: Takeshi Nakashima, Kobe (JP); Eiji Maruyama, Katano (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 498 days.

(21) Appl. No.: 12/067,983

(22) PCT Filed: Sep. 22, 2006

(86) PCT No.: PCT/JP2006/318835
§ 371 (c)(1),
(2), (4) Date: Jun. 9, 2008

(87) PCT Pub. No.: WO2007/040065
PCT Pub. Date: Apr. 12, 2007

(65) Prior Publication Data
US 2009/0107547 A1   Apr. 30, 2009

(30) Foreign Application Priority Data

Sep. 30, 2005   (JP) .................................. 2005-288739

(51) Int. Cl.
*H01L 31/04* (2006.01)
(52) U.S. Cl. .................... 136/243; 136/251; 136/256
(58) Field of Classification Search .......... 136/243–265
See application file for complete search history.

(56) References Cited

U.S. PATENT DOCUMENTS

| | | | | |
|---|---|---|---|---|
| 5,421,909 A | * | 6/1995 | Ishikawa et al. | 136/256 |
| 6,288,326 B1 | * | 9/2001 | Hayashi et al. | 136/251 |

FOREIGN PATENT DOCUMENTS

| | | |
|---|---|---|
| JP | 05-335610 | 12/1993 |
| JP | 10-326903 | * 5/1997 |
| JP | 10-326903 | 12/1998 |
| JP | 2003-167104 | 6/2003 |
| JP | 2005-043512 | 2/2005 |
| JP | 2006-146027 | 6/2006 |

* cited by examiner

*Primary Examiner* — Jeffrey T Barton
(74) *Attorney, Agent, or Firm* — Marvin A. Motsenbocker; Mots Law, PLLC

(57) ABSTRACT

A solar cell includes: a photoelectric conversion part having a concave and convex profile in a light receiving surface thereof; and a protective layer 10 which is provided to cover the concave and convex profile, and which includes particles therein. In a cross section, in parallel with an incident direction of light, of the protective layer 10, the number of the particles 11 contained in a second region is smaller than the number of particles 11 contained in a first region. The first region is centered at a concave portion of the concave and convex profile, and has a unit length, while the second region is centered at a convex portion of the concave and convex profile, and has the unit length.

4 Claims, 4 Drawing Sheets

SOLAR CELL AND SOLAR CELL MODULE

TECHNICAL FIELD

The present invention relates to a solar cell and a solar cell module.

BACKGROUND ART

In recent years, there has been an increasing demand for a clean energy because global warming has been predicted to occur due to the greenhouse effect caused by an increase of $CO_2$. While a nuclear power generation does not discharge $CO_2$, a method for processing the radioactive waste has not been established yet. For this reason, there is a demand for a clean energy with a higher level of safety. Among such expected clean energies, a solar cell particularly has high expectations because of its cleanness, safeness, and manageability.

A general solar cell has a photoelectric conversion part formed of a multilayer structure including a pn junction or a pin junction, which is formed by using: a crystalline semiconductor material, such as single-crystalline silicon and polycrystalline silicon; an amorphous semiconductor material typified by amorphous silicon; or a compound semiconductor material, such as GaAs and CuInSe. The solar cell is configured so that an electron-hole pair is generated in the photoelectric conversion part by incidence of light, and is then taken out to the outside via a pair of electrodes.

The solar cell is generally provided with a concave and convex profile, called a textured surface, on a light receiving surface of the photoelectric conversion part. Incident light beams are scattered by the concave and convex profile, so that the optical path length of each light beam incident in the photoelectric conversion part is increased. In this way, the photoelectric conversion efficiency is improved.

In addition, for the purpose of improving the photoelectric conversion efficiency and the weather resistance, Japanese Patent Application Publication No. Hei 5-335610 describes a technique in which a protective film containing particles on a light receiving surface is formed. Japanese Patent Application Publication No. Hei 5-335610 achieves an increase in photoelectric conversion efficiency by scattering light beans incident on the solar cell by using the particles in the protective film so as to increase the optical path length of each light beam in the photoelectric conversion part.

However, even when the protective film described in Japanese Patent Application Publication No. Hei 5-335610 is used in a solar cell provided with a textured surface in the light receiving surface, a sufficient photoelectric conversion efficiency has not been able to be obtained.

In view of the above-described problems, an object of the present invention is to provide a solar cell and a solar cell module each capable of obtaining a sufficient photoelectric conversion efficiency.

DISCLOSURE OF THE INVENTION

To achieve the above object, a first aspect of the present invention is a solar cell including: a photoelectric conversion part having a concave and convex profile in a light receiving surface thereof; and a protective layer which is provided to cover the concave and convex profile, and which includes particles therein. In addition, in the solar cell, in a cross section, in parallel with an incident direction of light, of the protective layer, the number of the particles contained in a second region is smaller than the number of the particles contained in a first region. Here, the second region is centered at a convex portion of the concave and convex profile, and has a unit length, while the first region is centered at a concave portion of the concave and convex profile, and has the unit length.

According to the solar cell of the first aspect, it is possible to reduce the amount of light which is scattered by the particles existing in a region corresponding to the convex portion, and which is thus emitted to the outside. Accordingly, the amount of light to be taken in the photoelectric conversion part can be increased. As a result, the photoelectric conversion efficiency can be improved.

In addition, in the solar cell according to the first aspect, it is preferable that the layer thickness of the protective layer be formed thinner in the second region than in the first region.

According to this solar cell, it is possible to easily obtain the protective layer in which the number of the particles is certainly smaller in the region corresponding to the convex portion of the concave and convex profile than in the region corresponding to the concave portion thereof.

In addition, in the solar cell according to the first aspect, it is preferable that the layer thickness of the protective layer formed in the first region is formed to be smaller than the difference in height between the convex portion and the concave portion of the concave and convex profile.

According to this solar cell, it is possible to further reduce the amount of light which is scattered by the particles existing in the region corresponding to the convex portion, and which is thus emitted to the outside. Accordingly, the amount of light to be taken in the photoelectric conversion part can be increased. As a result, the photoelectric conversion efficiency can be further improved.

A second aspect of the present invention is a solar cell module including a solar cell, a light-receiving-surface-side translucent member, a back-surface-side member, and a resin layer. The solar cell includes: a photoelectric conversion part having a concave and convex profile in a light receiving surface thereof; and a protective layer which is provided to cover the concave and convex profile, and which includes particles therein. In the solar cell, in a cross section, in parallel with an incident direction of light, of the protective layer, the number of the particles contained in a second region is smaller than the number of the particles contained in a first region. Here, the second region is centered at a convex portion of the concave and convex profile, and has a unit length, while the first region is centered at a concave portion of the concave and convex profile, and has the unit length. The light-receiving-surface-side translucent member is disposed on a side from which light is incident on the solar cell. The back-surface-side member is disposed on an opposite side to the side from which light is incident on the solar cell. The resin layer is disposed between the light-receiving-surface-side translucent member and the back-surface-side member, and seals the solar cell. In the solar cell module, the refractive index of the protective layer is an intermediate value between the refractive index of the resin layer and the refractive index of a material constituting the photoelectric conversion part.

According to the solar cell module of the second aspect, it is possible to reduce, among incident light, the amount of light reflecting off the interface between the resin layer and the protective layer, and also the amount of light reflecting off the interface between the protective layer and the photoelectric conversion part. As a result, light can be effectively utilized.

BEST MODES FOR CARRYING OUT THE INVENTION

Figure 1:
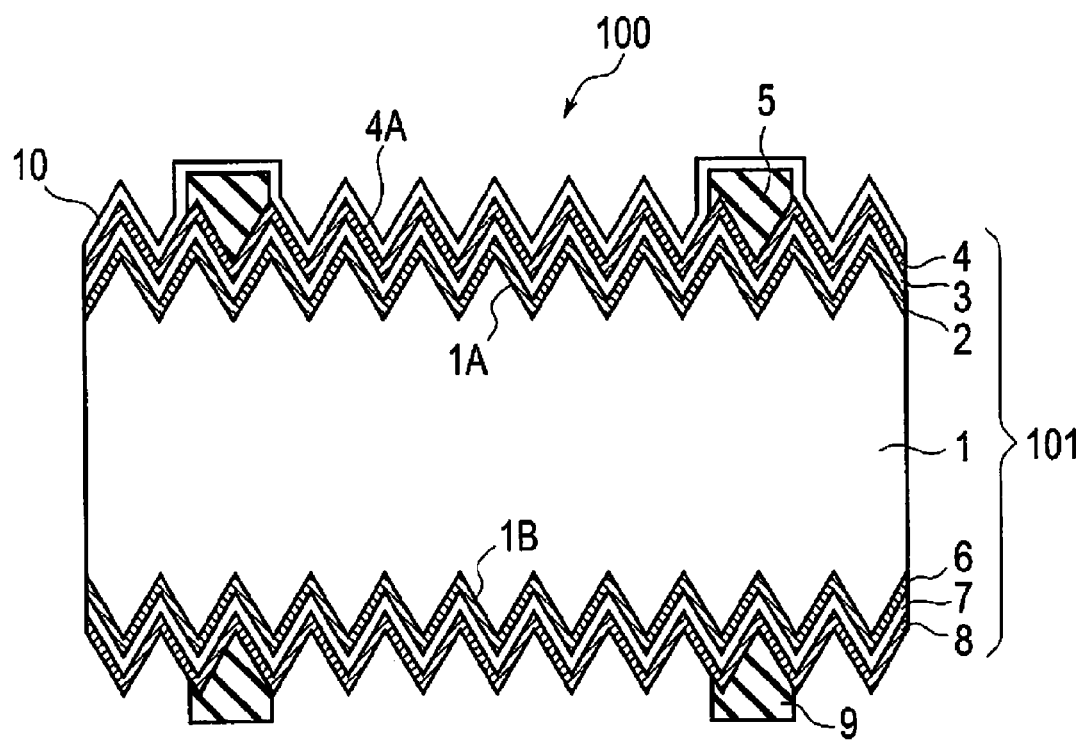
FIG. 1 is a schematic cross-sectional view of a solar cell according to an embodiment of the present invention.

Next, embodiments of the present invention will be described with reference to the drawings. In the following descriptions of the drawings, the same or similar reference numerals and symbols are attached to the same or similar components. However, it should be noted that the drawings are schematic, and that the dimensional proportions and the like are different from the real one. Accordingly, specific dimensions and the like should be determined in consideration of the following descriptions. In addition, it goes without saying that some parts are different in dimensional relationship and proportions among the drawings.

(Solar Cell)

A solar cell according to the embodiment of the present invention will be described with reference to FIG. 1, FIG. 2, and FIG. 3.

FIG. 1 is a schematic cross-sectional view for explaining the structure of a solar cell 100 according to the embodiment of the present invention. A substrate 1 is an n-type single-crystalline silicon substrate, and has a textured surface in a light receiving surface 1A thereof. An i-type amorphous silicon layer 2, a p-type amorphous silicon layer 3, and a light-receiving-surface-side transparent electrode layer 4 are sequentially stacked on the light receiving surface 1A of the substrate 1. The i-type amorphous silicon layer 2 has a thickness of approximately 10 nm, while the p-type amorphous silicon layer 3 also has a thickness of approximately 10 nm. The light-receiving-surface-side transparent electrode layer 4 is made of ITO, and has a thickness of approximately 100 nm. Incident light is incident from the light-receiving-surface-side transparent electrode layer 4 side. Since the substrate 1 has the textured surface in the light receiving surface 1A thereof, each of the i-type amorphous silicon layer 2, the p-type amorphous silicon layer 3, and the light-receiving-surface-side transparent electrode layer 4, which are all stacked on the light receiving surface 1A, also has a concave and convex profile in the light receiving surface thereof. Here, the concave and convex profile reflects the contour of the textured surface formed in the light receiving surface 1A of the substrate 1. Moreover, a light-receiving-surface-side electrode 5 for collecting electricity is partially formed on the light receiving surface of the light-receiving-surface-side transparent electrode layer 4. The light-receiving-surface-side electrode 5 is made of an electrically conductive paste, such as an Ag paste.

A back surface 1B of the single-crystalline silicon substrate 1 has a textured surface. An i-type amorphous silicon layer 6, an n-type amorphous silicon layer 7, and a back-surface-side transparent electrode layer 8 are sequentially stacked on the back surface 1B. The i-type amorphous silicon layer 6 has a thickness of approximately 10 nm, while the n-type amorphous silicon layer 7 also has a thickness of approximately 10 nm. The back-surface-side transparent electrode layer 8 is made of ITO, and has a thickness of approximately 100 nm. Moreover, a back-surface-side electrode 9 for collecting electricity is partially formed on the surface of the back-surface-side transparent electrode layer 8. The back-surface-side electrode 9 is made of a conductive paste, such as an Ag paste.

In the solar cell 100 according to this embodiment, a photoelectric conversion part 101 is formed of a laminated body of the light-receiving-surface-side transparent electrode layer 4, the p-type amorphous silicon layer 3, the i-type amorphous silicon layer 2, the n-type single-crystalline silicon substrate 1, the i-type amorphous silicon layer 6, the n-type amorphous silicon layer 7, and the back-surface-side transparent electrode layer 8. In addition, while corresponding to the light receiving surface of the photoelectric conversion part 101, the light receiving surface 4A of the light-receiving-surface-side transparent electrode layer 4 has a concave and convex profile.

A light-receiving-surface-side protective layer 10 is provided on the light receiving surface 4A of the photoelectric conversion part 101 to cover the light receiving surface 4A including the surface of each light-receiving-surface-side electrode 5. The light-receiving-surface-side protective layer 10 contains therein a large number of particles having a particle size of 20 nm to 100 nm, and being made of ZnO, $SiO_2$, ITO, MgO, $TiO_2$, $Al_2O_3$, or the like.

It should be noted that the structure of the photoelectric conversion part 101 in the solar cell of the present invention is not limited to that shown in FIG. 1. It is also possible to employ any of known structures including: one made of a crystalline semiconductor, and having a pn junction therein, such as a single-crystalline silicon solar cell and a polycrystalline silicon solar cell; and one having a pin junction therein, and being made of a thin film semiconductor, such as amorphous silicon and microcrystalline silicon.

Next, the structure of the light-receiving-surface-side protective layer 10 in the solar cell according to the present embodiment will be described in detail with reference to FIG. 2. FIG. 2 is a schematic cross-sectional view enlargedly showing the cross-sectional structure, in a vicinity of the light receiving surface 4A, of the photoelectric conversion part 101 in the solar cell 100 shown in FIG. 1.

Figure 2:
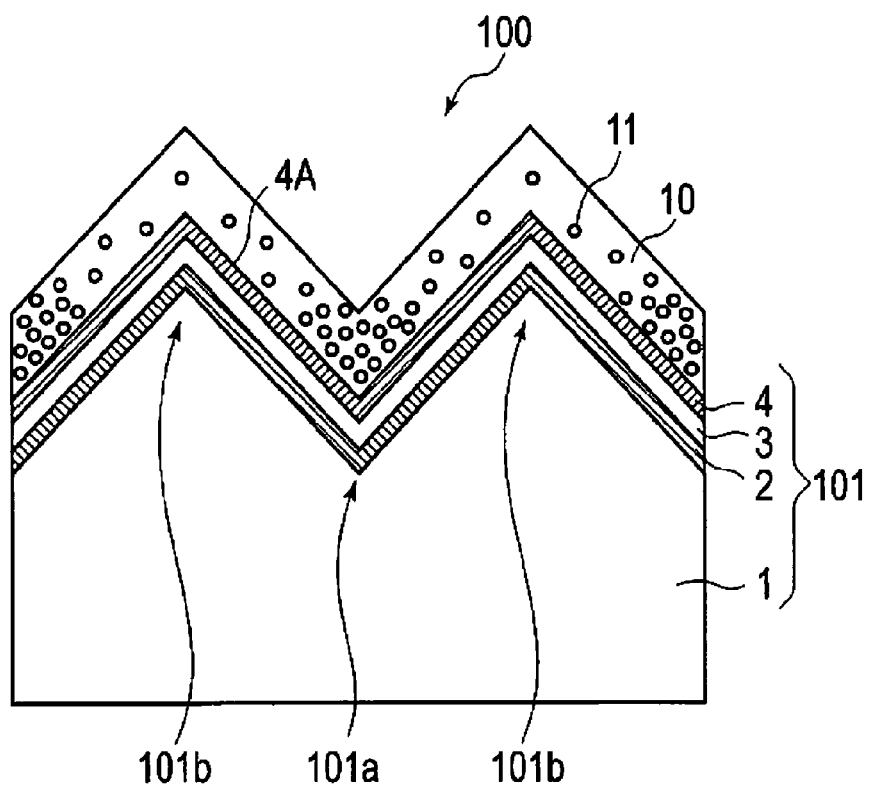
FIG. 2 is a schematic cross-sectional view of a light-receiving-surface-side protective layer in the solar cell according to the embodiment of the present invention.

As shown in FIG. 2, the light receiving surface 4A of the photoelectric conversion part 101 has a concave and convex profile. The light-receiving-surface-side protective layer 10 is formed to cover the entire surface of the concave and convex profile. In addition, the light-receiving-surface-side protective layer 10 contains the multiple particles 11 therein. Moreover, as shown in FIG. 3, in a cross section, in parallel with an incident direction of light, of the light-receiving-surface-side protective layer 10, the number A2 of the particles contained in a second region is smaller than the number A1 of the particles contained in a first region. Here, the first region is centered at a concave portion of the concave and convex profile to have a unit length (L+L=2L), while the second region is centered at a convex portion of the concave and convex profile to have the unit length (L+L=2L). In addition, it is preferable that the film thickness of the light-receiving-surface-side protective layer 10 be formed thinner in the second region (B2) centered at the convex portion than in the first region (B1) centered at the concave portion (see FIG.

6A). Moreover, the film thickness B1 of the light-receiving-surface-side protective layer 10 formed in the first region centered at the concave portion is preferably formed to be thinner than the difference B3 in height between the convex portion and the concave portion of the concave and convex profile.

Figure 7:
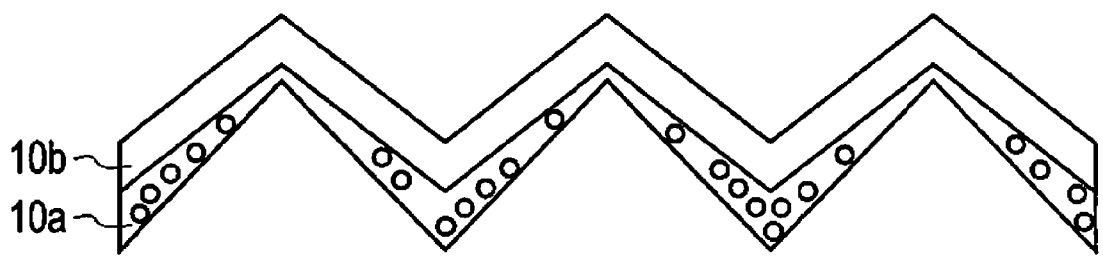
FIG. 7 is a schematic cross-sectional view of the light-receiving-surface-side protective layer in the solar cell according to Experiment 2.

Furthermore, the light-receiving-surface-side protective layer 10 may be formed in, instead of the one-layer structure, a two-layer structure of a first protective layer 10a and a second protective layer lob by using two kinds of coating materials containing particles with different viscosities, as shown in FIG. 7. In a similar manner, the light-receiving-surface-side protective layer 10 may be formed in a structure consisting of three layers or more.

As the material for the light-receiving-surface-side protective layer 10, a translucent organic material, such as acrylic resin, or a translucent inorganic material, such as $SiO_2$ may be used.

In addition, the particles employed here may be those having a particle size of approximately 20 nm to 100 nm and being made of a translucent material, such as ZnO, $SiO_2$, ITO, MgO, $TiO_2$, and $Al_2O_3$. For the particles, any material matching the material properties of the light-receiving-surface-side protective layer 10 may be chosen. Note that, when particles, such as ZnO or $TiO_2$, having an effect of blocking ultraviolet rays are employed, the effect of blocking ultraviolet rays by the light-receiving-surface-side protective layer 10 can be obtained. Accordingly, the amount of ultraviolet irradiation to a photovoltaic element is suppressed, so that the weather resistance is improved.

(Operation and Effect of Solar Cell According to the Present Embodiment)

Next, the operation and effect of the solar cell according to the present embodiment will be described with reference to FIG. 4.

Figure 4:
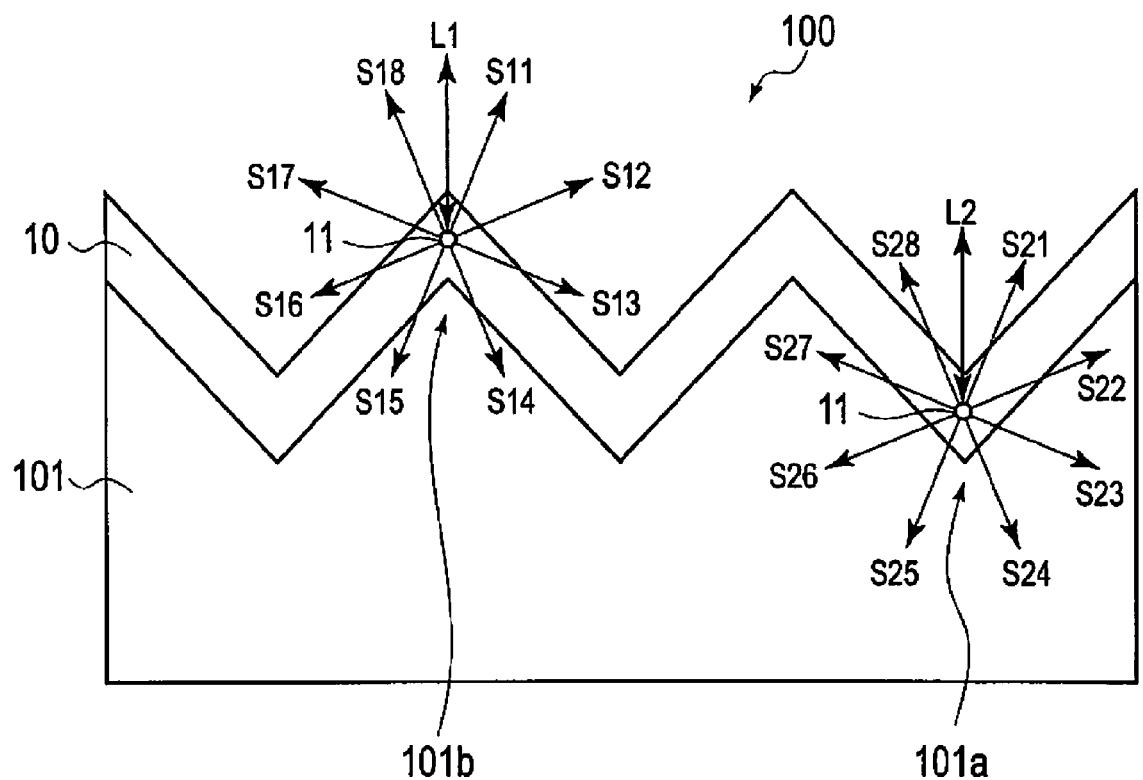
FIG. 4 is a schematic cross-sectional view for explaining the effect of the present invention.

FIG. 4 is a schematic cross-sectional view for explaining how incident light beams are scattered by the particles in the light-receiving-surface-side protective layer 10 which includes the particles 11, and which is provided to cover the concave and convex profile provided in the light receiving surface of the photoelectric conversion part 101.

Among light beams incident on the light receiving surface of the photoelectric conversion part 101, light beams L1 passing through a region corresponding to the convex portion 101b of the concave and convex profile are scattered, by the particle 11 in the light-receiving-surface-side protective layer 10, in directions indicated by the arrows S11, S12, S13, S14, S15, S16, S17, and S18. On the other hand, light beams L2 passing through a region corresponding to the concave portion 101a of the concave and convex profile are scattered, by the particle 11 in the light-receiving-surface-side protective layer 10, in directions indicated by the arrows S21, S22, S23, S24, S25, S26, S27, and S28.

Among these scattered light beams, the light beams scattered by the particle 11 in the region corresponding to the convex portion 101b of the concave and convex profile act in the following manner. The light beams scattered in the directions indicated by the arrows S14 and S15 are incident on the region corresponding to the convex portion 101b in the photoelectric conversion part 101, and eventually contribute to electric power generation in this region. In addition, the light beams scattered in the directions indicated by the arrows S13 and S16 are incident on the region corresponding to the adjacent concave portion 101a in the photoelectric conversion part 101, and eventually contribute to the electric power generation in this region.

Meanwhile, the light beams scattered in the directions indicated by the arrows S11, S12, S17, and S18 are not incident on the photoelectric conversion part 101, but reflect off in directions to the side from which the light beam is incident. As a result, these light beams do not contribute to the electric power generation.

On the other hand, the light beams scattered by the particle 11 in the region corresponding to the concave portion 101a of the concave and convex profile act in the following manner. The light beams scattered in the directions indicated by the arrows S22, S23, S24, S25, S26, and S27 are incident on a region in the vicinity of the concave portion 101a in the photoelectric conversion part 101, and eventually contribute to the electric power generation in this region. Meanwhile, the light beams scattered in the directions indicated by the arrows S21 and S28 are not incident on the photoelectric conversion part 101, but reflect off in directions to the side from which the light beam is incident. As a result, these light beams do not contribute to the electric power generation.

Here, as is clear from FIG. 4, the light beams incident on the region corresponding to the convex portion 101b of the concave and convex profile are more likely to be scattered by the particle 11, discharged in the directions to the side from which the light beam is incident, and thus not incident on the photoelectric conversion part, than the light beams incident on the region corresponding to the concave portion 101a of the concave and convex profile.

In the solar cell according to this embodiment, the number of the particles 11 dispersed in the light-receiving-surface-side protective layer 10 is smaller in the region corresponding to the convex portion 101b of the concave and convex profile than in the region corresponding to the concave portion 101a thereof. Accordingly, it is possible to reduce the ratio at which the light beams incident on the region corresponding to the convex portion 101b are discharged in the directions to the side from which the light beams are incident. In this way, the amount of light to be absorbed in the photoelectric conversion part 101 can be increased. As a result, the photoelectric conversion efficiency can be improved.

Note that, in FIG. 4, the descriptions have been given of the case where the particles 11 are contained in the light-receiving-surface-side protective layer 10 in the region corresponding to the convex portion 101b of the concave and convex profile. However, the present invention is not limited to this case. Suppose a case where the particles 11 are not contained in the light-receiving-surface-side protective layer 10 in the region on the convex portion 101b. In this case, light beams incident on the region on the convex portion 101b are not scattered by the particles 11, and are thus not discharged in the directions to the side from which the light beam is incident. Accordingly, a higher effect can be achieved.

Moreover, consider a case where the light-receiving-surface-side protective layer 10 has a large thickness in the region on the concave portion 101a of the concave and convex profile, so that the positions of some of the particles 11 become higher than the position of the apex of the convex portion 101b of the concave and convex profile. In this case, the ratio at which light beams reflect off in the directions to the side from which the light beams are incident is increased as in the case of the particles 11 contained in the light-receiving-surface-side protective layer 10 in the region on the convex portion 101b. For this reason, it is preferable that the positions of the particles 11 in the region on the concave portion 101a of the concave and convex profile be set lower than the position of the apex of the convex portion 101b of the concave and convex profile. In this respect, it is preferable that the film thickness of the light-receiving-surface-side protective layer 10 containing the particles 11 in the region on the concave portion 101a of the concave and convex profile be smaller than the difference in height between the convex portion 101b and the concave portion 101a of the concave and convex profile.

The light-receiving-surface-side protective layer 10 according to this embodiment may be formed in the following manner for example. Firstly, the concave and convex profile is coated, by a spray method or a printing method, with a low-viscosity coating material having the particles 11 dispersed therein. Then, the coating material is left untouched for an appropriate period of time to be hardened. In this event, the coating material applied to the concave and convex profile flows thereon to pool on the concave portion 101a until being hardened. Hence, the light-receiving-surface-side protective layer 10 can be formed thinner on the convex portion 101b than on the concave portion 101a. Accordingly, the light-receiving-surface-side protective layer 10 can be formed so that the number of the particles 11 can be smaller in the region on the convex portion 101b than in the region on the concave portion 101a.

Incidentally, when such low-viscosity coating material is used, the thickness of the light-receiving-surface-side protective layer 10 may possibly become too thin in the region on the convex portion 101b of the concave and convex profile, or the light-receiving-surface-side protective layer 10 may not be formed at all in the region on the convex portion 101b. This may result in a reduction in the weather resistance. In order to prevent this problem, the light-receiving-surface-side protective layer 10 may be formed of a first protective layer and a second protective layer. In this case, the first protective layer is formed by using a low-viscosity coating material containing the particles 11, while the second protective layer is formed by using a high-viscosity coating material. Forming the second protective layer by using a high-viscosity coating material in this way makes it possible to form the light-receiving-surface-side protective layer 10 having a sufficient thickness even in the region on the convex portion 101b of the concave and convex profile. As a result, the solar cell having a favorable weather resistance can be provided.

Note that, the particles may be dispersed, or may not exist, in the second protective layer. In the case of dispersing the particles, the density of the particles is preferably lower than that of the particles in the first protective layer. Moreover, in this case, the thicknesses respectively of the first and second protective layers are preferably adjusted so that the height of the light-receiving-surface-side protective layer 10 in the region on the concave portion 101a of the concave and convex profile will be smaller than the height between the convex portion 101b and the concave portion 101a of the concave and convex profile.

(Solar Cell Module)

Next, a solar cell module using the solar cell according to the present invention will be described with reference to a cross-sectional view shown in FIG. 5.

Figure 5:
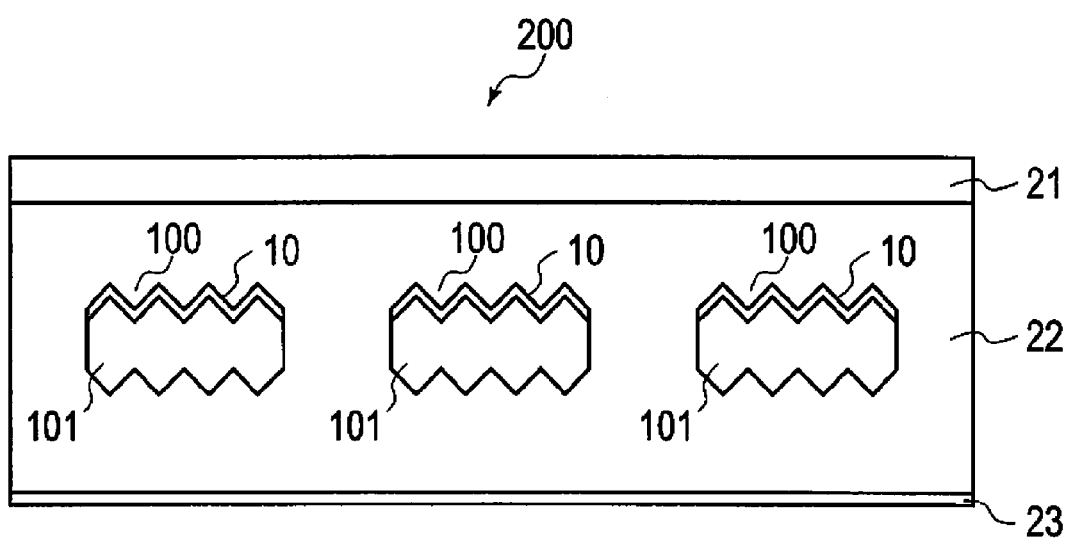
FIG. 5 is a schematic cross-sectional view of a solar cell module according to the embodiment of the present invention.

As shown in FIG. 5, a solar cell module 200 includes: the solar cells 100 described above; a light-receiving-surface-side translucent member 21 disposed on the side from which light beams are incident on the solar cells 100; a back-surface-side member 23 disposed on the opposite side to the side from which light beams are incident on the solar cells 100; and a resin 22 which is disposed between the light-receiving-surface-side translucent member 21 and the back-surface-side member 23, and which seals the solar cells 100. Each of the solar cells 100 includes: the photoelectric conversion part 101 having the concave and convex profile in the light receiving surface thereof; and the light-receiving-surface-side protective layer 10 provided to cover the concave and convex profile.

The light-receiving-surface-side translucent member 21 is made of, for example, a translucent material, such as glass and plastic. The back-surface-side member 23 is made of, for example, a member such as a metal, plastic, a resin film, and glass. The multiple solar cells 100 are electrically connected to one another in series or in parallel by using an unillustrated wiring member, and are sealed by the translucent sealing resin layer 22 for sealing, between the light-receiving-surface-side translucent member 21 and the back-surface-side member 23.

Accordingly, light beams are incident on the solar cells 100 through the light-receiving-surface-side translucent member 21 and the resin layer 22. The refractive index of the light-receiving-surface-side protective layer 10, which is provided on the light receiving surface of each solar cell 100, is an intermediate value between the refractive index of the resin layer 22 and the refractive index of the material constituting the photoelectric conversion part 101.

For example, for the resin layer 22, the refractive index of glass-EVA is approximately 1.5. For the photoelectric conversion part 101, the refractive indices of ITO, c-Si, and a-Si are approximately 2.0, 3.45, and 3.8, respectively. Accordingly, it is preferable that the refractive index of the material constituting the light-receiving-surface-side protective layer 10 be approximately 1.5 to 2.0, or 1.5 to 3.8.

In addition, in a case where the particles are added to the light-receiving-surface-side protective layer 10, the refractive index here is assumed to be an intermediate value between the refractive indices respectively of the particles and the material of the light-receiving-surface-side protective layer 10. For example, when ZnO is used as the particles, since the refractive index of ZnO is approximately 2.0, the total refractive index of the light-receiving-surface-side protective layer 10 with the particles being added thereto becomes a value closer to 2.0. On the other hand, if the difference in refractive index between the resin layer 22 and the light-receiving-surface-side protective layer 10 is large, a reflection on the interface between the resin layer 22 and the light-receiving-surface-side protective layer 10 is increased. In this regard, considering that the difference in refractive index is to be set at least 0.1 while the refractive index becomes close to 2.0 by the addition of ZnO, it is more preferable that the refractive index of the material constituting the light-receiving-surface-side protective layer 10 be 1.5 to 1.6.

(Operation and Effect of Solar Cell Module According to the Present Embodiment)

The solar cell module of the present embodiment is capable of reducing the amount of light reflecting off the interface between the resin layer 22 and the light-receiving-surface-side protective layer 10, and also the amount of light reflecting off the interface between the light-receiving-surface-side protective layer 10 and the photoelectric conversion part 101. As a result, light can be utilized more effectively.

EXAMPLE

Hereinafter, examples of the present invention will be described.

(Fabrication of Photoelectric Conversion Part)

Firstly, the photoelectric conversion part 101 shown in FIG. 1 was fabricated in the following manner.

As the substrate 1, an n-type single-crystalline silicon substrate having a specific resistance of approximately 1 Ω·cm and a thickness of 300 μm was used. After the substrate 1 was cleaned by a general method, the textured surface was formed in each of the light receiving surface 1A and the back surface 1B of the substrate 1 by etching.

Subsequently, by a general plasma CVD method, the i-type amorphous silicon layer 2 having a thickness of 10 nm and the p-type amorphous silicon layer 3 having a thickness of 10 nm were formed on the light receiving surface 1A of the substrate 1, as well as the i-type amorphous silicon layer 6 having a thickness of 10 nm and the n-type amorphous silicon layer 7 having a thickness of 10 nm were formed on the back surface 1B thereof.

The film-forming conditions for the above amorphous silicon layers are shown in Table 1. In Table 1, "i-type" indicates the i-type amorphous silicon layer 2 and the i-type amorphous silicon layer 6, "p-type" indicates the p-type amorphous silicon layer 3, and "n-type" indicates the n-type amorphous silicon layer 7. In addition, $B_2H_6$ and $PH_3$ are diluted respectively to 2% and 1% by using $H_2$ gas.

TABLE 1

| AMORPHOUS SILICON | GAS FLOW RATE | | | | SUBSTRATE TEMPERATURE (° C.) | PRESSURE OF GAS-DISCHARGE (Pa) | POWER OF DISCHARGE (mV/cm$^2$) |
|---|---|---|---|---|---|---|---|
| | SiH$_4$ | B$_2$H$_6$ (2%) | PH$_3$ (1%) | H$_2$ | | | |
| p-TYPE | 40 | 40 | — | 0~100 | 170 | 40 | 8.33 |
| n-TYPE | 40 | — | 40 | 0~100 | 170 | 40 | 8.33 |
| i-TYPE | 40 | — | — | 0~100 | 170 | 40 | 8.33 |

Next, the back-surface-side transparent electrode layer 8 and the light-receiving-surface-side transparent electrode layer 4, each having a thickness of 100 nm and being made of ITO, were formed, by a sputtering method, respectively on the n-type amorphous silicon layer 7 and the p-type amorphous silicon layer 3, which are formed respectively on the principal surfaces of the n-type single-crystalline silicon substrate 1.

The photoelectric conversion part 101 fabricated in the above-described manner was formed of a laminated body of the light-receiving-surface-side transparent electrode layer 4, the p-type amorphous silicon layer 3, the i-type amorphous silicon layer 2, the n-type single-crystalline silicon substrate 1, the i-type amorphous silicon layer 6, the n-type amorphous silicon layer 7, and the back-surface-side transparent electrode layer 8. Then, the back-surface-side electrode 9 and the light-receiving-surface-side electrode 5 each having a comb shape were formed, by a screen printing method, in predetermined regions respectively on the back surface and on the light receiving surface of the photoelectric conversion part 101.

(Fabrication of Protective Layer)
(Experiment 1)

Subsequently, the light-receiving-surface-side protective layers 10 were formed by applying coating materials, by a printing method, on the light-receiving-surface-side transparent electrode layer 4 and the light-receiving-surface-side electrode 5, both of which are formed on the light receiving surface of the n-type single-crystalline silicon substrate 1 of the photoelectric conversion part 101. Here, the coating materials contain particles of a ZnO filler but have different viscosities.

When the light-receiving-surface-side protective layer 10 was formed, each of the coating materials was obtained in the following manner. ZnO having a particle size of approximately 20 nm was used as the particles, while acrylic resin was used as the coating material. The ZnO particles and a diluent were mixed with the coating material, and then stirred, so that the coating material having the ZnO particles substantially uniformly dispersed therein was obtained.

In addition, the adjustment of the viscosity of the coating material was performed by adjusting the addition amount of the diluent. Specifically, the viscosity of the coating material can be increased by decreasing the addition amount of the diluent, while the viscosity of the coating material can be decreased by increasing the addition amount of the diluent.

Four types of coating materials obtained in the above described manner, and having different viscosities were each used to form the light-receiving-surface-side protective layer 10. In this way, four types of solar cells (Samples 1 to 4) were fabricated. Then, the photoelectric conversion efficiency was measured for each of Samples 1 to 4.

Table 2 shows the results of short circuit currents (Isc) obtained as the photoelectric conversion efficiencies. Note that, in FIG. 2, the viscosity of each coating material is indicated by a value standardized by taking the smallest value as 1. In addition, the amount of each applied coating material is indicated by a value obtained by standardizing the amount of the coating material added to each Sample by taking the amount for Sample 1 as 1. Moreover, each Isc value is indicated by a value standardized by taking, as 1, the value of the solar cell having the light-receiving-surface-side protective layer 10 formed using the coating material having the highest viscosity.

TABLE 2

| | VISCOSITY | AMOUNT OF COARTING | Isc |
|---|---|---|---|
| SAMPLE 1 | 1 (STANDARD VALUE) | 1 (STANDARD VALUE) | 1.008 |
| SAMPLE 2 | 1.8 | 1 | 1.005 |
| SAMPLE 3 | 3.2 | 1 | 1.001 |
| SAMPLE 4 | 4.6 | 1 | 1.000 (STANDARD VALUE) |

Figure 6A:
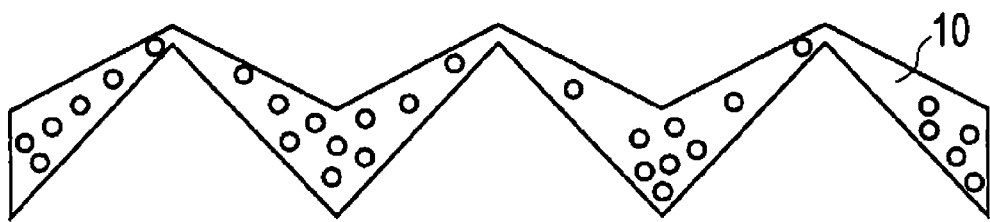
FIGS. 6A and 6B are schematic cross-sectional views of a light-receiving-surface-side protective layer in a solar cell according to Experiment 1.
Figure 6B:
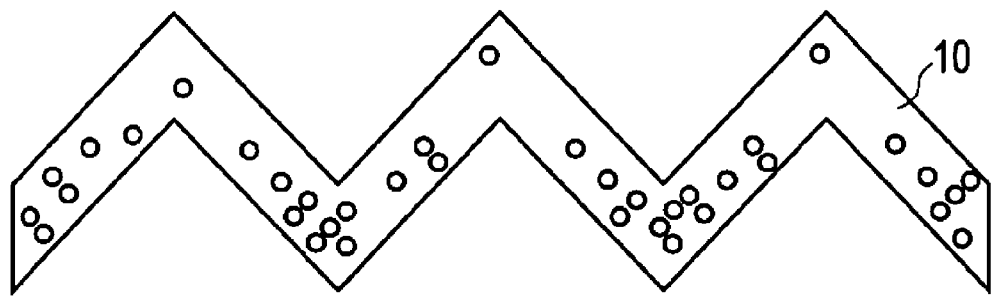

Sample 1 has the lowest viscosity. For this reason, as shown in FIG. 6A, the thickness of the protective layer in a region corresponding to a concave portion is significantly larger than the thickness of the protective layer in a region corresponding to a convex portion. On the other hand, Sample 4 has the highest viscosity. For this reason, as shown in FIG. 6B, the thickness of the protective layer in a region corresponding to a concave portion is not so different from the thickness of the protective layer in a region corresponding to a convex portion.

As can be seen from Table 2, a higher Isc can be obtained by forming the light-receiving-surface-side protective layer 10 by using a coating material having a lower viscosity.

The distribution of the particles in the light-receiving-surface-side protective layer 10 formed on the concave and convex profile of each of Samples 1 to 4 was observed by using a transmission electron microscope (TEM) with a magnification of ×30000. Table 3 shows the result of the number and the number density of the particle contained in a vicinity of the concave portion of each of Samples 1 to 4.

TABLE 3

| | THE NUMBER OF THE PARTICLES | THE NUMBER DENSITY OF THE PARTICLES |
|---|---|---|
| SAMPLE 1 | 170 | 1.24 |
| SAMPLE 4 | 0.998 | 0.999 |
| SAMPLE 5 | 171 | 170 |

The definitions of the number and the number density of the particles will be described referring to FIG. 3, which schematically shows the structure assumed from factors including the result of the observation using TEM.

Figure 3:
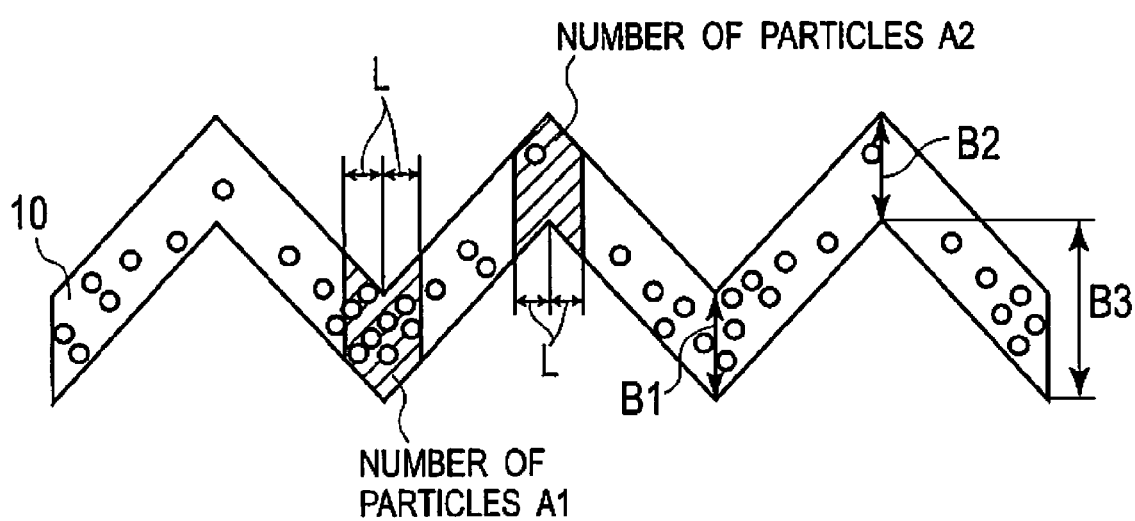
FIG. 3 is a schematic cross-sectional view for explaining in detail the structure of the light-receiving-surface-side protective layer shown in FIG. 2.

The unit length 2L centered at each of the concave portion and the convex portion shown in FIG. 3 was specifically set, in Table 3, to be a width of 2.4 µm in total, by providing a width of approximately 1.2 µm for each of both sides of the corresponding one of the concave portion and the convex portion. Then, the number of the particles contained in the protective layer in this range was counted as the number of the particles. Moreover, the number density was defined as a value obtained by dividing the number of the particles by the area (of the shaded portion) of the protective layer included in this range. Values obtained in the above-described manner were standardized by taking the value of the convex portion as 1, and the resultant values of the standardization are shown in Table 3.

Note that, taking into consideration that the length between the convex and concave portions adjacent to each other was approximately 12 µm, the value 1.2 µm used in Table 3 was defined as a tenth of that length. The value is not limited to 1.2 µm. It is possible to use any value appropriate to show the region in a vicinity of each of the concave and convex portions.

As shown in Table 3, in the solar cell of Sample 4 having the light-receiving-surface-side protective layer 10 formed by using the coating material with a large viscosity, the light-receiving-surface-side protective layer 10 was formed to have a substantially uniform film thickness over the concave and convex profile provided in the light receiving surface of the photoelectric conversion part. The particles thereof were also substantially uniformly dispersed in the light-receiving-surface-side protective layer 10. In other words, the number and the number density of particles in the light-receiving-surface-side protective layer 10 in the region on the convex portion of the concave and convex profile were approximately the same as those in the light-receiving-surface-side protective layer 10 in the region on the concave portion.

On the other hand, in the solar cell of Sample 1 having the light-receiving-surface-side protective layer 10 formed by using the coating material with a small viscosity, the light-receiving-surface-side protective layer 10 was formed to have a film thickness thinner in the region on the convex portion of the concave and convex profile than in the region on the concave portion thereof. In other words, the number of the particles in the light-receiving-surface-side protective layer 10 in the region on the convex portion of the concave and convex profile was smaller than that in the light-receiving-surface-side protective layer 10 in the region on the concave portion thereof.

In addition, since the protective layer hardly including particles was formed in a vicinity of the convex portion, the number density was also larger in the concave portion. It should be noted that, in Samples 2 and 3, the number of the particles was larger in the concave portion due to the difference in film thickness, but the number density was substantially the same between the concave portion and the convex portion.

Moreover, in any of Samples 1 to 4, the film thickness of the light-receiving-surface-side protective layer 10 formed on the concave portion of the concave and convex profile was smaller than the difference in height between the convex portion and the concave portion of the concave and convex profile.

The above-described results give the following conclusion. When the number of the particles contained in the region centered at the convex portion to have the unit length is smaller than that in the region centered at the concave portion to have the unit length, it is possible to reduce, among incident light, the amount of light reflecting off in directions to the side from which the light is incident, and thus not contributing to electric power generation. Accordingly, the efficiency in using incident light can be improved. For this reason, the short-circuit current can be increased.

(Experiment 2)

Next, as shown in FIG. 7, a solar cell having a light-receiving-surface-side protective layer 10 of a two-layer structure formed by using two types of coating materials with different viscosities was fabricated as Sample 5.

Firstly, as in the case of Sample 1, ZnO particles having a particle size of 20 nm were mixed with acrylic resin in such a manner that the density of Zno in the mixture after dried is in a range from 67 wt % to 83 wt %. In addition, by using cyclohexanone as a diluent, the viscosity was adjusted. Then, the coating material having a standardized viscosity of in Table 2 was applied to the light receiving surface of the photoelectric conversion part, and thereafter was hardened, so that the first protective layer 10a was formed. Subsequently, a coating material containing no ZnO particle, and having a standardized viscosity of 4.6 in Table 2 was applied to the first protective layer, and thereafter was hardened, so that the second protective layer 10b was formed.

In this way, the solar cell was provided with the light-receiving-surface-side protective layer 10 of a two-layer structure formed of the first protective layer and the second protective layer. The photoelectric conversion efficiency of the solar cell was measured as a standardized value of 1.007, which is approximately the same as that of Sample 1. In addition, as to the distribution of particles in the light-receiving-surface-side protective layer 10 formed on the concave and convex profile of Sample 5, Table 3 shows the number and the number density of particles contained in a vicinity of the concave portion, while the number and the number density are obtained by observation using the transmission electron microscope (TEM) with a magnification of ×30000.

Think about the case of the solar cell having the two-layer structure of the light-receiving-surface-side protective layers 10a and 10b as described above. Even in this case, when the number of the particles contained in the region centered at the convex portion with the unit length is smaller than that in the region centered at the concave portion with the unit length, it is possible to reduce, among incident light, the amount of light reflecting off in directions to the side from which the light is incident, and thus not contributing to electric power generation. Accordingly, the efficiency in using incident light can be improved. For this reason, the short-circuit current can be increased.

In addition, in the solar cell of Sample 5, the second protective layer is formed by using the coating material with a high viscosity. Accordingly, the thickness of the light-receiving-surface-side protective layer 10 in the convex portion of the concave and convex profile can be made thicker than that of Sample 1. For this reason, a solar cell having an excellent weather resistance can be provided.

As described above, according to the present invention, it is possible to provide a solar cell that effectively utilizes incident light, thus having an excellent photoelectric conversion efficiency.

(Experiment 3)

Next, a solar cell having a light-receiving-surface-side protective layer 10 of a two-layer structure formed by using two types of coating materials with different viscosities was fabricated as Sample 6. The structure of Sample 6 was the same as that of Sample 5. However, in the Sample 6, after a first protective layer was applied, a second protective layer was formed without hardening the first protective layer. Then, after the application of the second protective layer, these layers were thermally hardened. The other conditions were the same as those of Sample 5.

In Sample 6, convection of the particles in the coating material occurred during the thermal hardening, so that there was not much difference in density distribution in the depth direction between the concave portion and the convex portion. In other words, the following fact was found. Specifically, in Sample 5 had the two-layer structure in which the layer containing no particle is formed on the layer containing the particles in the high density. On the other hand, in Sample 6, since the two types of materials were continuously applied and then dried, no distribution of the particles was observed in the depth direction. Accordingly, the layer containing the particles in the high density was formed in the concave portion, while the layer containing the particles in the low density was formed in the convex portion.

In each of Samples 2 to 4, the concave region and the convex region of the concave and convex structure were caused to have a difference in film thickness, although the number density was made substantially the same in between by controlling the viscosities. In this way, the number of the particles on each of the two regions was controlled. On the other hand, in Sample 6, the density of particles in the protective layer in each of the concave portion and the convex portion was controlled while the film thickness was made the same in between. In this way, the structure in which the number of the particles is large on the concave portion but small on the convex portion was achieved.

In addition, Sample 6 is advantageous in that the process of hardening the first protective layer is unnecessary as compared with Sample 5. Moreover, Sample 6 also has an advantage in that, because a clear interface does not exist between the first protective layer and the second protective layer, reflection of light and concentration of stress are unlikely to occur at the interface.

In addition, the photoelectric conversion characteristic of the solar cell according to Sample 6 was measured as a standardized value of 1.008, which is approximately the same Isc as that of Sample 1. In other words, it is found that the high density of particles on the concave portion and the low density of particles on the convex portion improve Isc.

The present invention has been described so far on the basis of the embodiments. However, the embodiments are mere illustrations, and it is to be understood by those skilled in the art that various modifications may be made on combinations of the constituent elements and processes of these embodiments, and such modifications are also included in the scope of the present invention.

FIELD OF THE INDUSTRIAL APPLICATION

As described above, the solar cell and the solar cell module according to the present invention effectively utilize light beams to be absorbed in the photoelectric conversion part by scattering incident light beams, and therefore can be favorably employed as a solar cell and a solar cell module with improved output characteristics.

The invention claimed is:

1. A solar cell characterized by comprising:
   a photoelectric conversion part (101) having a concave and convex profile in a light receiving surface thereof; and
   a protective layer (10) which is provided to cover the concave and convex profile, and which includes particles therein, and which has a concave and convex profile in both surfaces thereof,
   the solar cell characterized in that
   in a cross section, in parallel with an incident direction of light, of the protective layer (10), the number of the particles (11) contained in a second region is smaller than the number of the particles (11) contained in a first region, the second region being centered at a convex portion of the concave and convex profile, and having a unit length, the first region being centered at a concave portion of the concave and convex profile, and having the unit length.

2. The solar cell according to claim 1, characterized in that the layer thickness of the protective layer (10) is formed thinner in the second region than in the first region.

3. The solar cell according to any one of claims 1 and 2, characterized in that the layer thickness of the protective layer (10) formed in the first region is formed to be smaller than the difference in height between the convex portion and the concave portion of the concave and convex profile.

4. A solar cell module characterized by comprising:
   a solar cell (100) including: a photoelectric conversion part (101) having a concave and convex profile in a light receiving surface thereof; and a protective layer (10) which is provided to cover the concave and convex profile, and which includes particles therein, and which has a concave and convex profile in both surfaces thereof, in which solar cell, in a cross section, in parallel with an incident direction of light, of the protective layer (10), the number of the particles (11) contained in a second region is smaller than the number of the particles (11) contained in a first region, the second region being centered at a convex portion of the concave and convex profile, and having a unit length, the first region being centered at a concave portion of the concave and convex profile, and having the unit length;
   a light-receiving-surface-side translucent member (21) disposed on a side from which light is incident on the solar cell;
   a back-surface-side member (23) disposed on an opposite side to the side from which light is incident on the solar cell; and
   a resin layer (22) which is disposed between the light-receiving-surface-side translucent member and the back-surface-side member, and which seals the solar cell,
   the solar cell module characterized in that
   the refractive index of the protective layer (10) is an intermediate value between the refractive index of the resin layer (22) and the refractive index of a material constituting the photoelectric conversion part (101).

* * * * *